United States Patent

Fukusyo

[11] Patent Number: 6,066,511
[45] Date of Patent: May 23, 2000

[54] MANUFACTURING METHOD FOR A SOLID STATE IMAGING DEVICE

[75] Inventor: Takashi Fukusyo, Kanagawa, Japan

[73] Assignee: Sony Corporation, Tokyo, Japan

[21] Appl. No.: 08/701,223

[22] Filed: Aug. 21, 1996

[30] Foreign Application Priority Data

Aug. 23, 1995 [JP] Japan .................. P07-214347

[51] Int. Cl.[7] .................................................. H01L 21/00
[52] U.S. Cl. ................................ 438/60; 438/69; 438/70
[58] Field of Search ...................... 438/60, 69, 70

[56] References Cited

U.S. PATENT DOCUMENTS

| | | | |
|---|---|---|---|
| 5,514,888 | 5/1996 | Sano et al. | 257/232 |
| 5,585,280 | 12/1996 | Kwasnick et al. | 437/4 |
| 5,593,913 | 1/1997 | Aoki | 437/53 |
| 5,595,930 | 1/1997 | Baek | 437/53 |
| 5,670,384 | 9/1997 | Needham | 437/3 |

*Primary Examiner*—Wael Fahmy
*Assistant Examiner*—Long Pham
*Attorney, Agent, or Firm*—Hill & Simpson

[57] ABSTRACT

A solid-state imaging device Comprising a photosensing portion for performing opto-electric conversion and a light shielding film formed so as not to cover a photosensing surface of the photosensing portion. An overcoat layer formed of a first transparent material is formed so as to cover the photosensing surface of the photosensing portion, and a recessed portion is formed in the overcoat layer at a position just above the photosensing surface. The recessed portion has a top surface having a concavity toward the photosensing surface. A lens portion formed of a second transparent material having a refractive index higher than that of the first transparent material is embedded in the recessed portion.

20 Claims, 3 Drawing Sheets

MANUFACTURING METHOD FOR A SOLID STATE IMAGING DEVICE

BACKGROUND OF THE INVENTION

1. Field of the Invention

The present invention relates generally to the field of solid-state imaging devices, and, more particularly, the present invention relates to an improved lens structure for a CCD imaging device and a manufacturing method therefor.

2. Description of the Related Art

In solid-state imaging devices there is a region such as a transfer register which does not directly contribute to opto-electric conversion for each pixel. Therefore the opening ratio of the actual photosensing surface of a photosensing portion to the entire pixel surface is usually 50% or less. This is an inefficient use of the incident light. To eliminate this problem and to increase overall sensitivity, an increase in the ratio of the photosensing surface to the whole pixel surface has been considered. However, increasing the ratio of the actual photosensing surface is limited from a structural point of view.

In recent years, a solid-state imaging device having a so-called micro on-chip lens has been developed. In such a device, a convex microlens is provided above the photosensing surface to converge incident light on the photosensing surface, thereby effecting efficient light convergence and improving the effective opening ratio.

FIG. 3 is a side sectional view of an essential portion of solid-state imaging device having such a convex micro on-chip lens in the related art. Referring to FIG. 3, reference numeral 1 denotes a solid-state imaging device, and reference numeral 2 denotes a semiconductor substrate, such as a silicon wafer. In a surface layer of the semiconductor substrate 2, a photosensing portion 3 for performing opto-electric conversion is formed. A reading portion 4 and a transfer register 5 are formed on one side of the photosensing portion 3, and a channel stop 6 is formed on the other side of the photosensing portion 3.

An insulating film 7 is formed on the surface of the semiconductor substrate 2, and a transfer electrode 8 for driving the transfer register 5 is formed on the insulating film 7 at a position just above the transfer register 5. An interlayer insulating film 9 is formed on the insulating film 7 and the transfer electrode 8. A light shielding film 10 is formed on the interlayer insulating film 9 so as to cover the transfer electrode 8 in order to prevent the incidence of light on the transfer register 5. The light shielding film 10 formed on the interlayer insulating film 9 does not cover a photosensing surface 3a of the photosensing portion 3. Further, an interlayer film (planarizing film) 11 of a transparent material is formed over the surface of the semiconductor substrate 2 so as to cover the photosensing surface 3a of the photosensing portion 3 and the light shielding film 10.

A color filter 12 is formed on a unit pixel consisting of these components, and a convex micro on-chip lens 13 of a transparent resin or the like is formed on the color filter 12 so as to be convex on one side opposite to the photosensing surface 3a. The micro on-chip lens 13 is located so as to focus incident light on the photosensing surface 3a of the photosensing portion 3. In the solid-state imaging device 1 having the above configuration, when light is incident on the micro on-chip lens 13 as shown by the arrows in FIG. 3, the incident light is converged on the photosensing surface 3a by the light converging effect of the micro on-chip lens 13, thereby improving the effective opening ratio in the solid-state imaging device 1.

In manufacturing the solid-state imaging device 1, the micro on-chip lens 13 in particular is obtained usually by forming a transparent resin layer of styrene resins on the color filter 12 and then dry-etching the transparent resin layer. Alternatively, the micro on-chip lens 13 is obtained by directly subjecting a transparent resin layer to a thermal reflow process or by first forming a resist layer on the transparent resin layer and then subjecting the resist layer to a thermal reflow process. Thus, the micro on-chip lens 13 is obtained directly or indirectly by utilizing a surface tension of the resin layer or the resist layer.

However, the related art solid-state imaging device has the following disadvantages. In manufacturing the solid-state imaging device 1, the micro on-chip lens 13 in particular is formed after forming the color filter 12. Accordingly, the micro on-chip lens 13 to be formed is influenced by the planarity or the like of the color filter 12, which makes it difficult to control the working accuracy and shape uniformity of the micro on-chip lens 13.

Since the micro on-chip lens 13 is formed after forming the color filter 12, film formation for the micro on-chip lens 13 at high temperatures not less than 200 degrees Celsius cannot be performed. Accordingly, there is a very limited range of materials which can be selected for forming the micro on-chip lens 13. At present, only a material having a refractive index of about 1.5 can be selected.

While the micro on-chip lens 13 is formed usually of thermosetting styrene resins, this material has a low heat resistance and a low moisture resistance. Accordingly, there is fear of age deterioration of the lens 13 formed of this material.

It is accordingly an object of the present invention to provide a solid-state imaging device and a manufacturing method therefor which can eliminate the disadvantages associated with the fabrication of the micro on-chip lens in the related art by providing a lens different from the above-mentioned related art micro on-chip lens, thereby improving light convergence efficiency.

SUMMARY OF THE INVENTION

According to the present invention, a solid-state imaging device comprises a photosensing portion for performing opto-electric conversion and a light shielding film formed so as not to cover a photosensing surface of the photosensing portion. An overcoat layer is formed so as to cover the photosensing surface of the photosensing portion, the overcoat layer is formed of a first transparent material which conforms to the surface to form a recessed portion formed in the overcoat layer at a position just above the photosensing surface of the photosensing portion. The overcoat layer is also referred to as a conforming layer. The recessed portion has a top surface having a concavity formed toward the photosensing surface. A lens is embedded in the recessed portion which is formed of a second transparent material having a refractive index higher than that of the first transparent material. The lens has a bottom surface convex toward the photosensing surface.

In the solid-state imaging device of the present invention, the recessed portion having a top surface having a concavity formed toward the photosensing surface is formed in the overcoat layer at a position just above the photosensing portion, and the lens portion formed of the second transparent material having a refractive index higher than that of the first transparent material forming the overcoat layer is embedded in the recessed portion. The lens having a bottom surface convex toward the photosensing surface.

Accordingly, due to the difference in refractive index between the second transparent material forming the lens portion and the first transparent material forming the overcoat layer, light incident on the lens portion is refracted at the interface between the convex bottom surface of the lens portion and the overcoat layer, resulting in convergence of the light toward the center of the photosensing surface.

The present invention also comprises a manufacturing method for manufacturing the above-mentioned device. In the manufacturing method for the solid-state imaging device of the present invention, the overcoat layer is formed so as to cover the photosensing surface of the photosensing portion and the light shielding film and form the recessed portion. The overcoat layer conforms to the surface shape of the device and thereby forms the recessed portion at a position just above the photosensing surface. The lens layer is then formed so as to fill the recessed portion. Thereafter, the surface of the lens layer is planarized. Accordingly, a lens is formed from the lens layer embedded in the recessed portion formed in the overcoat layer. Thus, the solid-state imaging device mentioned above can be obtained.

DESCRIPTION OF THE PREFERRED EMBODIMENTS

Figure 1:
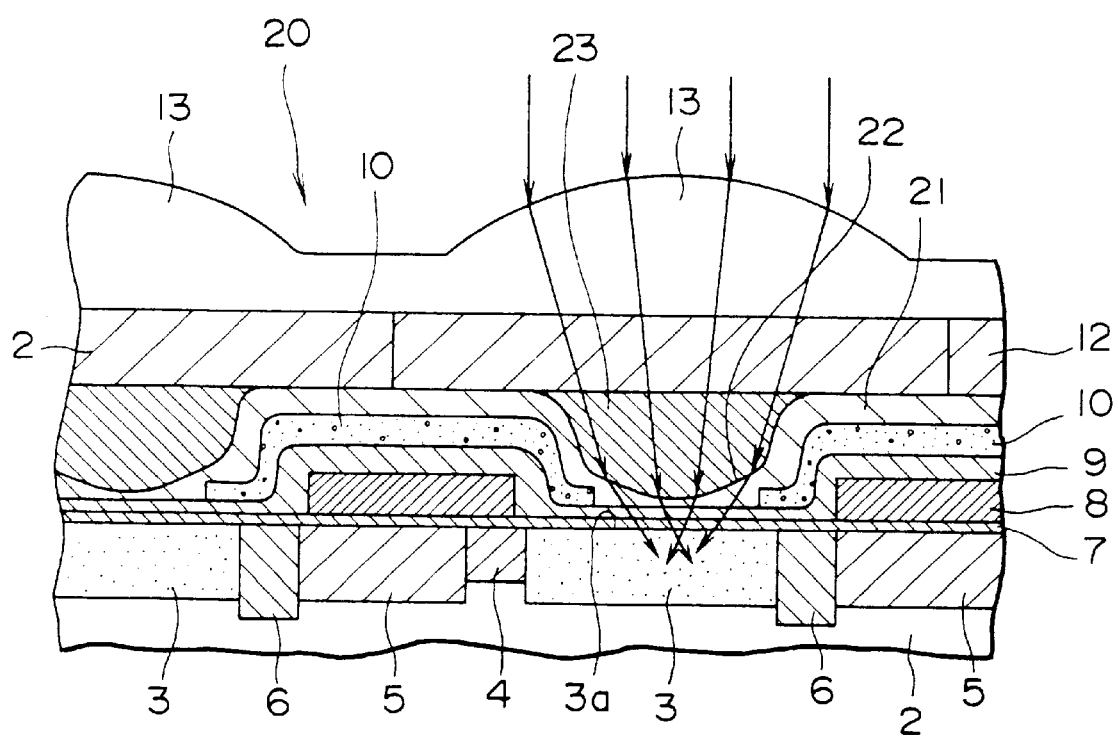
FIG. 1 is a side sectional view showing the schematic configuration of a preferred embodiment of the solid-state imaging device of the present invention.

FIG. 1 is a sectional view which illustrates a preferred embodiment of the solid-state imaging device of the present invention. In FIG. 1, reference numeral 20 denotes a solid-state imaging device according to the preferred embodiment. In a surface layer of the semiconductor substrate 2, a photosensing portion 3 for performing opto-electric conversion is formed. A reading portion 4 and a transfer register 5 are formed on one side of the photosensing portion 3, and a channel stop 6 is formed on the other side of the photosensing portion 3.

An insulating film 7 is formed on the surface of the semiconductor substrate 2, and a transfer electrode 8 for driving the transfer register 5 is formed on the insulating film 7 at a position just above the transfer register 5. An interlayer insulating film 9 is formed on the insulating film 7 and the transfer electrode 8. A light shielding film is formed on the interlayer-insulating film 9 so as to cover the transfer electrode 8 in order to prevent the incidence of light on the transfer register 5. The light shielding film 10 formed on the interlayer insulating film 9 does not cover a photosensing surface 3a of the photosensing portion 3.

Figure 3:
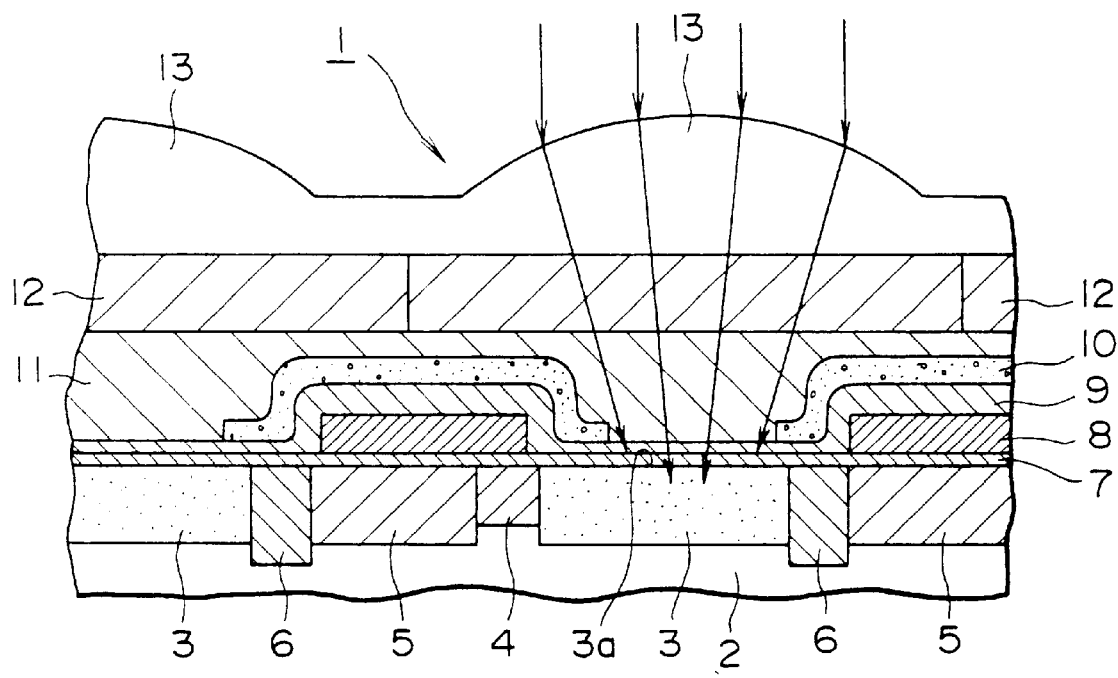
FIG. 3 is a side sectional view showing the schematic configuration of a solid-state imaging device in the related art.

The solid-state imaging device 20 differs from the solid-state imaging device 1 shown in FIG. 3 in that an overcoat layer 21 is substituted for the interlayer film 11, a recessed portion 22 is formed in the overcoat layer 21, and a lens portion 23 is embedded in the recessed portion 22. The recessed portion 22 is provided just above a photosensing surface 3a, and the top surface of the recessed portion 22 having a concavity toward the photosensing surface 3a. As will be hereinafter described, the recessed portion 22 is formed in a self-aligned manner so as to correspond to the surface shape of the light shielding film 10. The overcoat layer 21 forming the recessed portion 22 is formed of a first transparent material. More specifically, the overcoat layer 21 is formed from an SiO2 film having a refractive index of about 1.45, such as an SiO2 film formed from TEOS (tetraethoxy silane) by plasma CVD or an SiO2 film formed from other materials by CVD.

The lens portion 23 is formed by embedding a second transparent material in the recessed portion 22 as will be hereinafter described. The second transparent material has a refractive index higher than that of the first transparent material. For example, the lens portion 23 is formed from a nitride film by CVD, such as an SiN film having a refractive index of about 2.0, formed by plasma CVD. The upper surface of the lens portion 23 is planarized together with the upper surface of the overcoat layer 21 by planarization to be hereinafter described. Accordingly, the upper surfaces of the overcoat layer 21 and the lens portion 23 are flush with each other.

In the solid-state imaging device 20 having this configuration, the lens portion 23 is embedded in the recessed portion 22 and has a bottom surface is convex toward the photosensing surface 3a. Accordingly, due to a difference in the refractive index between the second transparent material of the lens portion 23 and the first transparent material of the overcoat layer 21, light incident on the lens portion 23 is refracted at the interface between the bottom surface of the lens portion 23 and a portion of the overcoat layer 21 just above the photosensing surface 3a. This structure efficiently transmits incident light to the photosensing surface 3a. That is, when light is incident on a micro on-chip lens 13 as shown by the arrows in FIG. 1, the light is once refracted to be converged by the micro on-chip lens 13, then entering the lens portion 23. When outgoing from the lens portion 23, the light is refracted again at the interface between the bottom surface of the lens portion 23 and the overcoat layer 21 in a direction towards the center of the photosensing portion. Accordingly, the structure efficiently transmits incident light to the photosensing surface 3a.

In the case where the lens portion 23 is formed from an SiN (P-SiN) film by plasma CVD, hydrogen contained in the P-SiN film in its manufacturing process acts to reduce an interface state density of a dark component in the solid-state imaging device 20. This provides an improvement in S/N ratio.

In the case that an interlayer insulating film 9 is formed from an SiO2 film by CVD, the refractive index of the interlayer insulating film 9 becomes the same as that of the overcoat layer 21. Accordingly, it is possible to prevent incident light from being refracted at the interface between the overcoat layer 21 and the interlayer insulating film 9 at positions corresponding to the opposite end portions of a photosensing portion 3. This prevents light from entering the transfer registers 5 which causes smearing. Furthermore, in reproducing a color filter 12 to be peeled off, the peeling of the color filter 12 can be stopped at the lens portion 23, thereby stabilizing a reproduction process for the color filter 12.

Figure 2A:
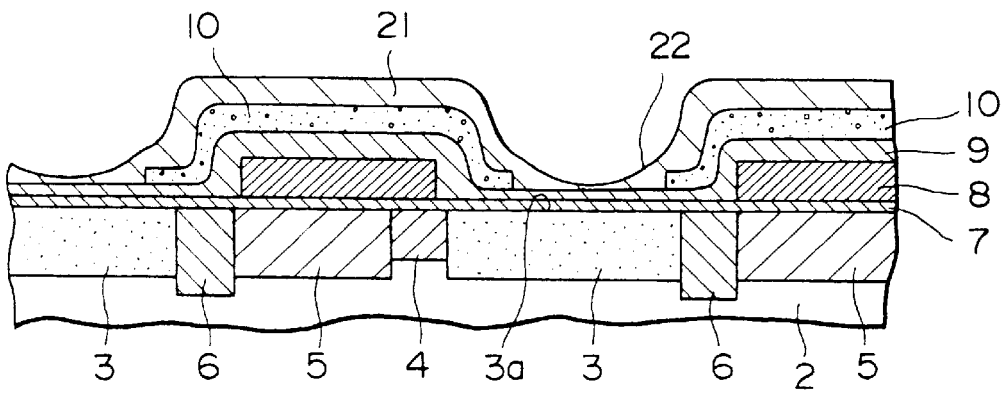
FIGS. 2(a) to 2(c) are side sectional views of an essential part for illustrating the steps of the manufacturing method for the solid-state imaging device of the present invention.

A preferred exemplary embodiment of the manufacturing process for the present invention for manufacturing the solid-state imaging device 20 mentioned above is described below. As shown in FIG. 2(a), essential parts including a photosensing portion 3, a reading portion 4, a transfer register 5, and a channel stop 6 are formed on a semiconductor substrate by related art techniques including photoresist formation and ion implantation. Then, an insulating film 7, a transfer electrode 8, an interlayer insulating film 9, and a light shielding film 10 are formed on the above-mentioned parts by related art techniques including photoresist formation, ion implantation, thermal oxidation, deposition, lithography, and etching.

Then, an overcoat layer 21 is formed so as to cover the interlayer insulating film 9 and the adjacent light shielding films 10 and correspond to the shape of the surfaces of the interlayer insulating film 9 and the adjacent light shielding films 10. This layer is also referred to as a conforming layer. The overcoat layer 21 is formed of SiO2 as the first transparent material, and it is manufactured specifically by a deposition process by plasma CVD using TEOS (tetraethoxy silane) as a raw material. By depositing the SiO2 film in this manner, the resultant overcoat layer 21 is formed so as to correspond to the shape of the surfaces of the interlayer insulating film 9 and the adjacent light shielding films 10, with the result that a recessed portion 22 is formed just above the photosensing portion 3 between the adjacent light shielding films 10.

Figure 2B:
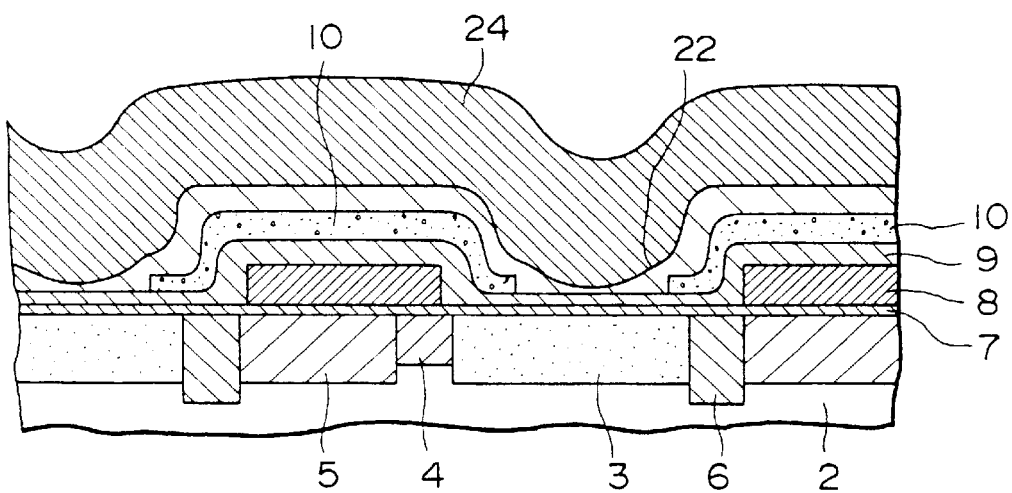

As shown in FIG. 2(b), an SiN film (second transparent material) is deposited on the overcoat layer 21 by plasma CVD to thereby form a lens layer 24 of the SiN film in the condition that it is securely embedded in the recessed portion 22.

Figure 2C:
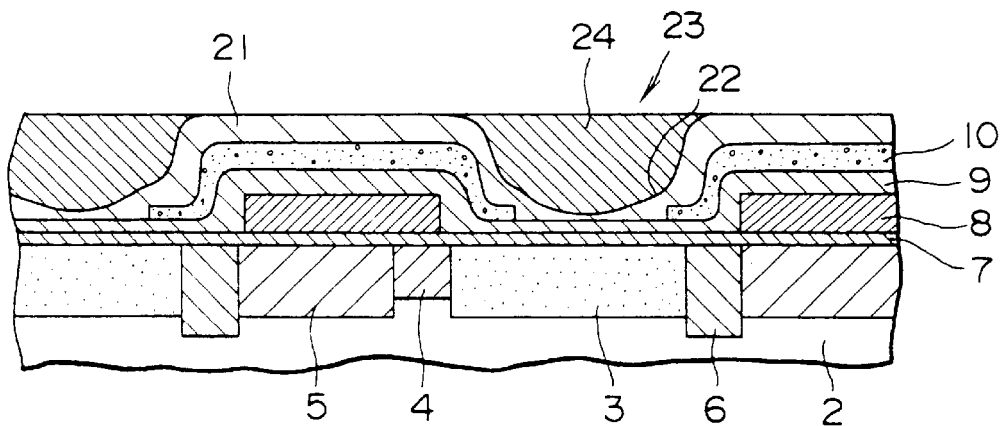

As shown in FIG. 2(c), the surface of the lens layer 24 is planarized by CMP (chemical-mechanical polishing) so that the lens layer 24 remains only in the recessed portion 22 and the overcoat layer 21 is exposed except at the recessed portion 22. The lens layer 24 thus remaining in the recessed portion 22 becomes a lens portion 23.

Further, a color filter 12 and a micro on-chip lens 13 (see FIG. 1) are sequentially formed on the surface of the lens portion 23 and the exposed surface of the overcoat layer 21 in a related art manner to obtain the solid-state imaging device 20 shown in FIG. 1.

According to the manufacturing method of the above preferred embodiment, the solid-state imaging device 20 exhibiting the above-mentioned operation and effect can be formed only by adding step of forming the lens layer 24 and the step of planarizing the lens layer 24 by the related art manufacturing method. Accordingly, the solid-state imaging device 20 having a higher efficiency of light convergence can be easily formed without a remarkable increase in manufacturing cost or the like as compared with related art methods.

While the micro on-chip lens 13 is formed on the color filter 12 in the above preferred embodiment, the present invention is not limited to this configuration, but various modifications may be made. For example, the micro on-chip lens 13 may be eliminated, and the convergence efficiency may be improved only by the lens portion 23. In this case, it is possible to avoid the possibility of degradation in accuracy or shape or the like of the color filter 12 in association with the formation of the lens portion 23. Further, since the lens portion 23 is embedded in the recessed portion 22, age deterioration of the lens portion 23 is prevented to allow improvement in heat resistance, moisture resistance, and light resistance.

As described above, according to the solid-state imaging device of the present invention, the recessed portion having a top surface having a concavity toward the photosensing surface is formed in the overcoat layer at a position just above the photosensing portion, and the lens portion formed of the second transparent material having a refractive index higher than that of the first transparent material forming the overcoat layer is embedded in the recessed portion. Accordingly, as a result of the difference in refractive index between the second transparent material forming the lens portion and the first transparent material forming the overcoat layer, light incident on the lens portion is refracted at the interface between the convex bottom surface of the lens portion and the overcoat layer. Accordingly, the incident light can be efficiently converged on the photosensing surface.

Further, the convergence efficiency can be improved without providing a micro on-chip lens on a color filter as in the related art. Accordingly, the disadvantages associated with the fabrication of the micro on-chip lens can be eliminated.

According to the manufacturing method for the solid-state imaging device of the present invention, the overcoat layer is formed so as to cover the photosensing surface of the photosensing portion and the light shielding film and form the recessed portion by conforming to the surface shape of the light shielding film at a position just above the photosensing surface. Thereafter, the lens layer is formed so as to fill the recessed portion. Thereafter, the surface of the lens layer is planarized. Accordingly, the solid-state imaging device can be easily manufactured.

The present invention is subject to many variations, modifications and changes in detail. It is intended that all matter described throughout the specification and shown in the accompanying drawings be considered illustrative only. Accordingly it is intended that the invention be limited only by the spirit and scope of the appended claims.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

I claim as my invention:

1. A method of manufacturing a solid state imaging device comprising the steps of:
    providing a semiconductor body having a photosensing portion thereon;
    applying a first layer having a first index of refraction to said semiconductor body, said first layer having a recessed portion above said photosensing portion, said recessed portion having a top surface having a concavity toward said photosensing portion; and
    embedding a material having a second index of refraction to form a first lens portion in said recessed portion, said first lens portion having a bottom surface convex toward said photosensing portion.

2. A method according to claim 1, wherein said step of embedding comprises a step of applying a second layer of said material to said first layer and planarizing a surface of said second layer.

3. A method according to claim 2, wherein said planarizing step comprises a step of chemical-mechanical polishing.

4. A method according to claim 1, wherein said step of applying said first layer comprises applying a silicon oxide film by CVD.

5. A method according to claim 1, further comprising a step of forming a second lens layer over said first lens portion.

6. A method according to claim 1 further comprising a step of forming a color filter layer over said first lens portion.

7. A method according to claim 1 wherein said second layer is silicon-nitride.

8. A method according to claim 7, wherein said second layer is applied by plasma CVD.

9. A method according to claim 1, wherein said step of providing a semiconductor body further comprises a step of providing a semiconductor body comprising a transfer register adjacent to said photosensing portion, a transfer electrode over said transfer register and a light shielding film over said transfer electrode; and further wherein said step of applying said first layer comprises a step of applying said first layer over said light shielding film and said photosensing portion.

10. A method according to claim 9, wherein said recessed portion of said first layer is formed in a self-aligned manner so as to correspond to the shape of the surface of said light shielding film.

11. A method of manufacturing a solid state imaging device comprising the steps of:

providing a semiconductor body having a photosensing portion, a transfer register adjacent to said photosensing portion, a transfer electrode over said transfer register and a light shielding film over said transfer electrode;

applying a first layer having a first index of refraction over said light shielding film and said photosensing portion, said first layer having a recessed portion above said photosensing portion, wherein said recessed portion of said first layer is formed in a self-aligned manner so as to correspond to the shape of the surface of said light shielding film, said recessed portion having a top surface convex toward said photosensing portion; and embedding a material having a second index of refraction higher than said first index to form a first lens portion, said first lens portion having a bottom surface convex toward said photosensing portion.

12. A method according to claim 11, wherein said step of embedding comprises applying a second layer of said material to said first layer and planarizing a surface of said second layer.

13. A method according to claim 12, wherein said planarizing step comprises a step of chemical-mechanical polishing.

14. A method according to claim 11, wherein said first layer is silicon oxide applied by CVD.

15. A method according to claim 11, further comprising a step of forming a lens layer over the lens portion.

16. A method according to claim 11, further comprising a step of forming a color filter layer over said first lens portion.

17. A method according to claim 11, wherein said second layer is silicon-nitride.

18. A method according to claim 17, wherein said second layer is applied by plasma CVD.

19. A method according to claim 13, wherein said second layer is planarized so that said second layer remains only in said recessed portion and said first layer is exposed except at said recessed portion.

20. A method of manufacturing a solid state imaging device comprising the steps of:

providing a semiconductor body having a photosensing portion, a transfer register adjacent to said photosensing portion, and a transfer electrode over said transfer register and a light shielding film over said transfer electrode;

applying a first layer of silicon oxide having a first index of refraction by CVD over said light shielding film and said photosensing portion, said first layer having a recessed portion above said photosensing portion and wherein said recessed portion of said first layer is formed in a self-aligned manner so as to correspond to the shape of the surface of said shielding film, said recessed portion having a top surface having a concavity toward said photosensing portion; and embedding a material having a second index of refraction higher than said first index to form a first lens portion in said recessed portion by applying a second layer of silicon-nitride by plasma CVD to said first layer and planarizing a surface of said second layer by chemical mechanical polishing so that the second layer remains only in the recessed portion and the first layer is exposed except at the recessed portion, said first lens portion having a bottom surface convex toward said photosensing portion.

* * * * *